US006583740B2

(12) United States Patent
Schofield et al.

(10) Patent No.: US 6,583,740 B2
(45) Date of Patent: Jun. 24, 2003

(54) CALIBRATED CURRENT SOURCE

(75) Inventors: William G. J. Schofield, North Andover, MA (US); Douglas A. Mercer, Bradford, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/990,983

(22) Filed: Nov. 21, 2001

(65) Prior Publication Data

US 2003/0094998 A1 May 22, 2003

(51) Int. Cl.[7] ................................................ H03M 1/66

(52) U.S. Cl. ....................... 341/120; 341/136; 327/416; 323/312

(58) Field of Search ................................ 341/118, 120, 341/133, 136, 144; 323/312; 327/416

(56) References Cited

U.S. PATENT DOCUMENTS 5,021,784 A * 6/1991 Groeneveld et al. ........ 341/120
5,793,231 A * 8/1998 Whittaker .................. 341/136
6,130,632 A * 10/2000 Opris ......................... 341/120
6,166,670 A * 12/2000 O'Shaughnessy ........... 341/136

OTHER PUBLICATIONS

Groeneveld et al., *A Self–Calibration Technique for Monolithic High–Resolution D/A Converters*, IEEE Journal of Solid–State Circuits, pp. 1517–1522, vol. 24, No. 6, Dec. 1989.

* cited by examiner

*Primary Examiner*—Howard L. Williams
(74) *Attorney, Agent, or Firm*—Iandiorio & Teska; Kirk Teska; R. Stephen Rosenholm

(57) ABSTRACT

A calibrated current source includes current source having an output node; a calibration circuit; a load circuit; a cascode switching circuit including a pair of cascode switches, one connected between the local circuit and output node, the other connected between the calibration circuit and the output node; and a bias circuit selectively applying a bias voltage to the cascode switches to selectively connect the load circuit and the calibration circuit to the output node while maintaining a constant voltage at the output node and across the current source to provide a consistent current to the load and calibration circuits.

5 Claims, 6 Drawing Sheets

CALIBRATED CURRENT SOURCE

FIELD OF THE INVENTION

This invention relates to a calibrated current source.

BACKGROUND OF THE INVENTION

It is imperative that current sources, when used in certain arrays, maintain a stable, fixed current output relative to one another. For example, in digital to analog converters (DAC's) a plurality of unit cells receive digital data that is converted to an analog output. For this purpose each unit cell includes a current source which to the extent possible is made identical with that of all of the other cell but still there are variations in the current source current outputs from cell to cell which introduces errors in the analog output. One approach to this problem employs a calibration technique in which all of the current sources are trimmed by increasing the current output by each of them to that of the maximum current output by any of them. Or choosing an intermediate value and increasing or decreasing the current provided by each to a defined level. This is done by switching each current source from its load, in a DAC the current switching circuit, to a calibration circuit which determines the value of current to be added or subtracted to meet the chosen level. While this has been successfully used, a further problem is introduced: when the switching between the load and calibration occurs, the voltage across the current source changes and since the current output varies as a function of the voltage across the current source, the calibration may still contain errors. D. Groenveld et al., *A Self-calibration Technique for Monolithic High-Resolution D/A Converters*, IEEE Journal of Solid-State Circuits, Vol. 24, pp. 1517–1522, December 1989.

BRIEF SUMMARY OF THE INVENTION

It is therefore an object of this invention to provide an improved calibrated current source.

It is a further object of this invention to provide such an improved calibrated current source which insures a more constant current in the load and calibration modes.

It is a further object of this invention to provide such an improved calibrated current source which insures a more constant voltage across the current source in the load and calibration modes.

It is a further object of this invention to provide such an improved calibrated current source which provides both improved isolation and more headroom.

The invention results from the realization that an improved, more accurate calibrated current source can be achieved by employing a cascode switch to switch the current source between the normal load and the calibration circuit so that the voltage across the current source is maintained constant in both the load and calibration modes thereby insuring that the current is the same in both modes and thus the calibrated trimming current added to or subtracted from the current source output is as close as possible to the required correction current making the output more accurate in the load mode.

This invention features a calibrated current source including a current source having an output node, a calibration circuit; and load circuit. There is a cascode switching circuit including a pair of cascode switches one connected between the load circuit and output node, the other connected between the calibration circuit and the output node. A bias circuit selectively applies a bias voltage to the cascode switches to selectively connect the load circuit and the calibration circuit to the output node while maintaining a constant voltage at the output node and across the current source to provide a consistent current to the load and the calibration circuits.

In a preferred embodiment the cascode switches may include FET's. The current source may include an FET. The load circuit may include an isolation cascode circuit. And the load circuit may include a current switching circuit.

BRIEF DESCRIPTION OF THE DRAWINGS

Other objects, features and advantages will occur to those skilled in the art from the following description of a preferred embodiment and the accompanying drawings, in which.

PREFERRED EMBODIMENT

Figure 1:
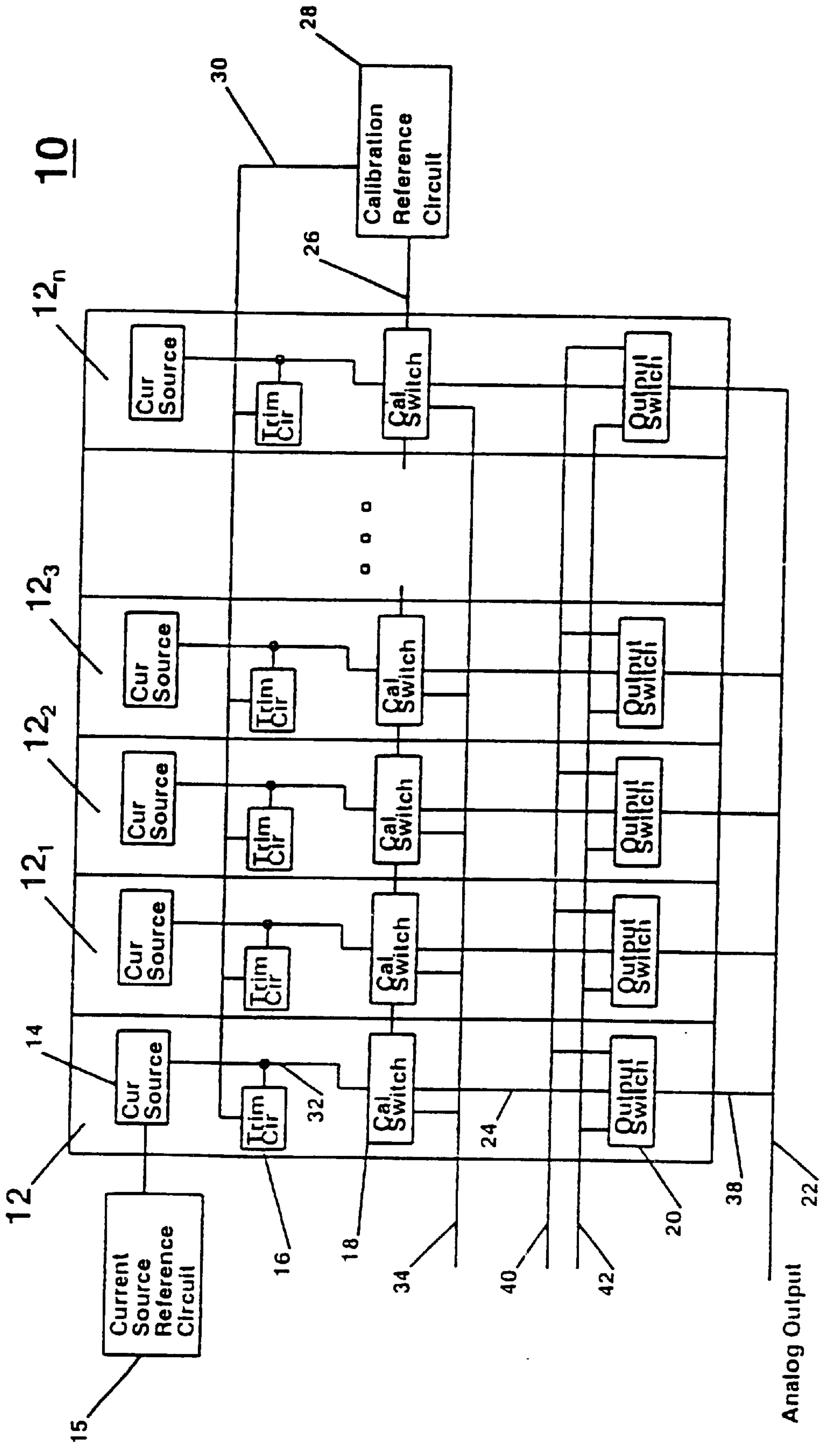
FIG. 1 is a simplified schematic block diagram of a prior art DAC.

There is shown in FIG. 1 a conventional digital to analog converter (DAC) including a plurality of unit cells 12, $\mathbf{12}_1$, . . . $\mathbf{12}_n$. Each cell, illustrated with respect to cell 12, includes a current source 14, trim circuit 16, calibration circuit 18 and current output switch 20. All of the output switches provide their analog outputs on the analog output network 22 where they are summed. Each calibration switch 18 connects current source 14 either over line 24 to the associated output switch 20 or over line 26 to calibration reference circuit 28. Calibration reference circuit 28 communicates over line 30 with each of trim circuits 16 communicating to each of them the amount of current that must be added or subtracted to the output current on line 32 from current source 14 to ensure that the output current from each of the current sources 14 in each of the cells 12, . . . $\mathbf{12}_n$ are equal. A control signal on line 34 sets calibration switch 18 either to the load mode where it connects current source 14 over line 24 to output switch 20 or over line 26 to calibration reference circuit 28 in the calibration mode. Each output switch 20 in addition to providing its output current on line 38 to analog output network 22 receives at its input data on lines 40 and 42.

Figure 2:
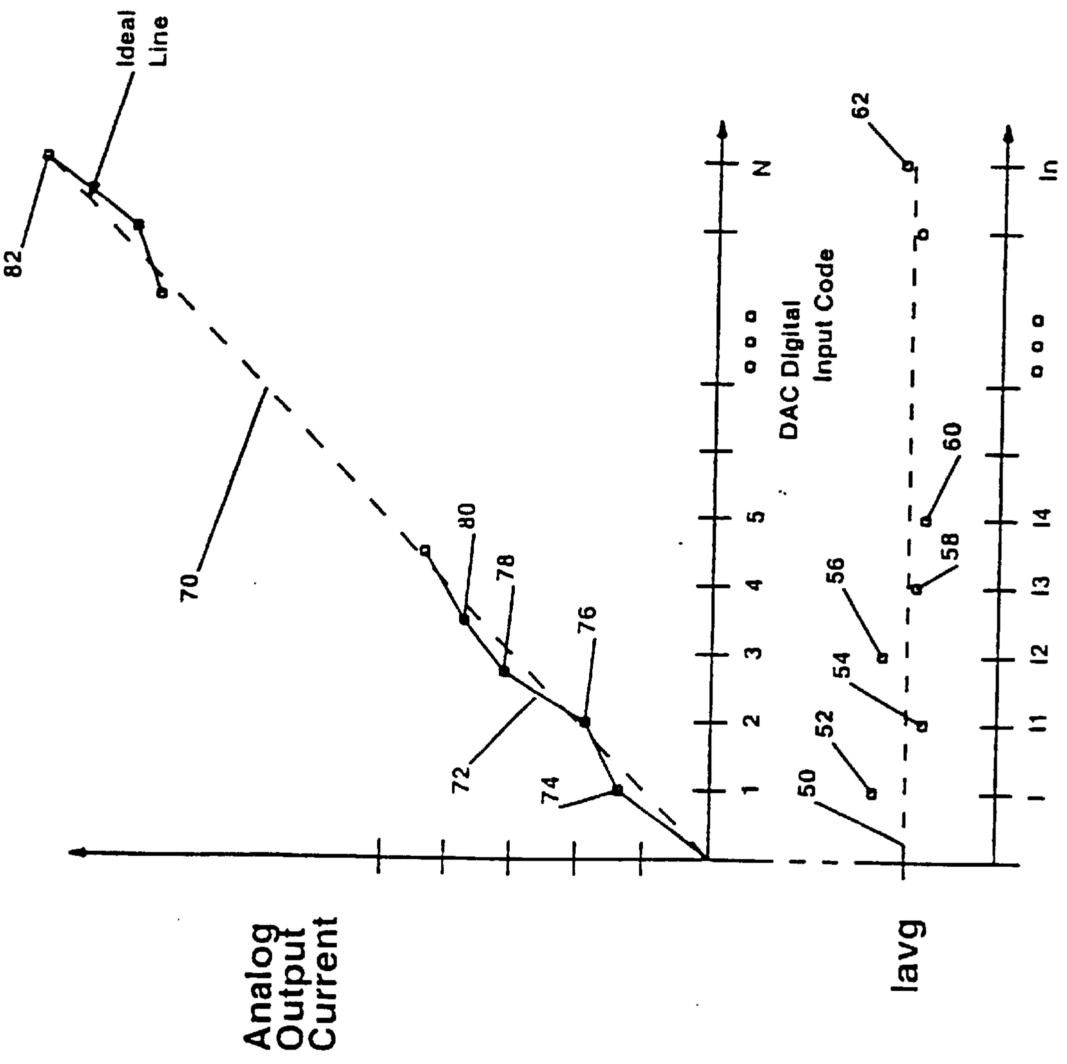
FIG. 2 illustrates the deviation in output current from the current sources of the cells of a DAC and their effect on the DAC analog output.

It is essential for the accuracy of the analog output on analog output network 22 that each of the current sources 14 provide exactly the same current when called upon by the data inputs on line 40 and 42. This can be seen more clearly in FIG. 2 where the current flow for each of the current sources I through $I_1$, $I_2$ . . . $I_n$ is shown deviating somewhat from the average, nominal, or desired current indicated at 50. Thus, current I at a level of 52 is slightly above the desired level, for current $I_1$ at level 54 slightly below, and current $I_2$ at 56 is slightly above, while currents $I_3$ and 14 at levels 58 and 60 are below the desired average. Ideally, if all of the currents, I–$I_n$ were equal the analog output level would appear as straight line 70 but since the currents I–Ias indicated are not equal the output will instead appear as at 72. This is because the input code 1 is represented at point 74 by the current I, whereas the input 2 is represented at point 76 by the combination of I and $I_1$. The input 3 at point 78 is represented by $I+I_1+I_2$. Input 4 at point 80 is represented by $I+I_1+I_2+I_4$. And at the nth point 82 the nth code input is equal to the summation of all of the currents $I–I_n$.

Figure 3:
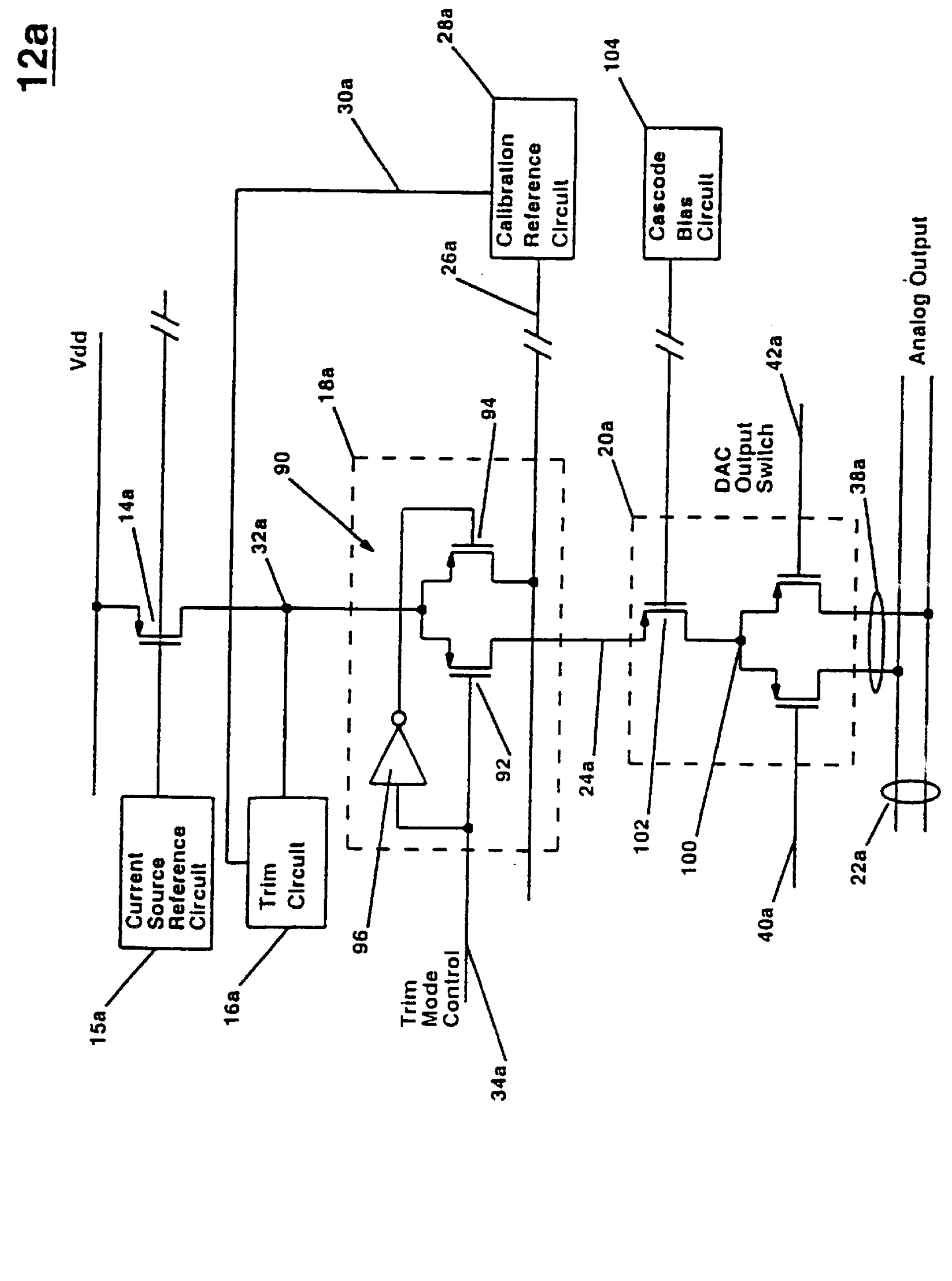
Fig. 3 (Prior Art)
FIG. 3 is a schematic block diagram of a prior art DAC cell with a calibrated current source.

One prior art approach to this problem employs a voltage mode switch 90, FIG. 3, implementing the calibration switch 18*a*. Voltage mode switch 90 includes two FET's 92 and 94 and calibration switch 18*a* also includes inverter 96 which is responsive to the trim mode control signal on line 34*a*. In operation cell 12*a* works as explained previously with respect to cell 12 through 12*n* in FIG. 1. The signal on line 34*a* operates FET switches 92 and 94 to switch from the load mode in which current source 14*a* is connected to current switch 20*a* to the calibration mode where current source 14*a* is connected to calibration reference circuit 28*a*. Calibration reference circuit 28*a* determines the amount of output current flowing on line 32*a* from current source 14*a*, compares it to a reference, whether it be the highest or an average or some other selected level, and then drives trim circuit 16*a* to add or subtract the proper amount of current to bring the output current of current source 14*a* to the desired level consistent with all of the current sources in all of the other cells. One problem with this approach is that the output of current source 14*a* is dependent not only on the input from current source reference circuit 15, but also is a function of the voltage across current source 14*a*. In this particular prior art approach there is no control over the voltage at output current node 32*a* and across current source 14*a*. That is, the voltage at node 32*a* may be entirely different in the calibration mode when calibration reference circuit 28*a* is connected to current source 14*a* as opposed to the load mode when current switch 20*a* is connected to current source 14*a*. This means that the determination of the trimming current to be provided by trim circuit 16*a* to the output current from current source 14*a* in order to make it consistent from cell to cell is not wholly reliable. Another shortcoming of this approach is that the use of the voltage mode switch 90 in the form of FET's 92 and 94 provides no additional isolation of node 32*a* from the common source node 100 of current switch, but it does use up part of the headroom, that is, the available voltage supply. Isolation is provided in this approach by means of an isolation cascode circuit 102 in output switch 20*a*. Cascode circuit 102 is operated by cascode bias circuit 104.

Figure 4:
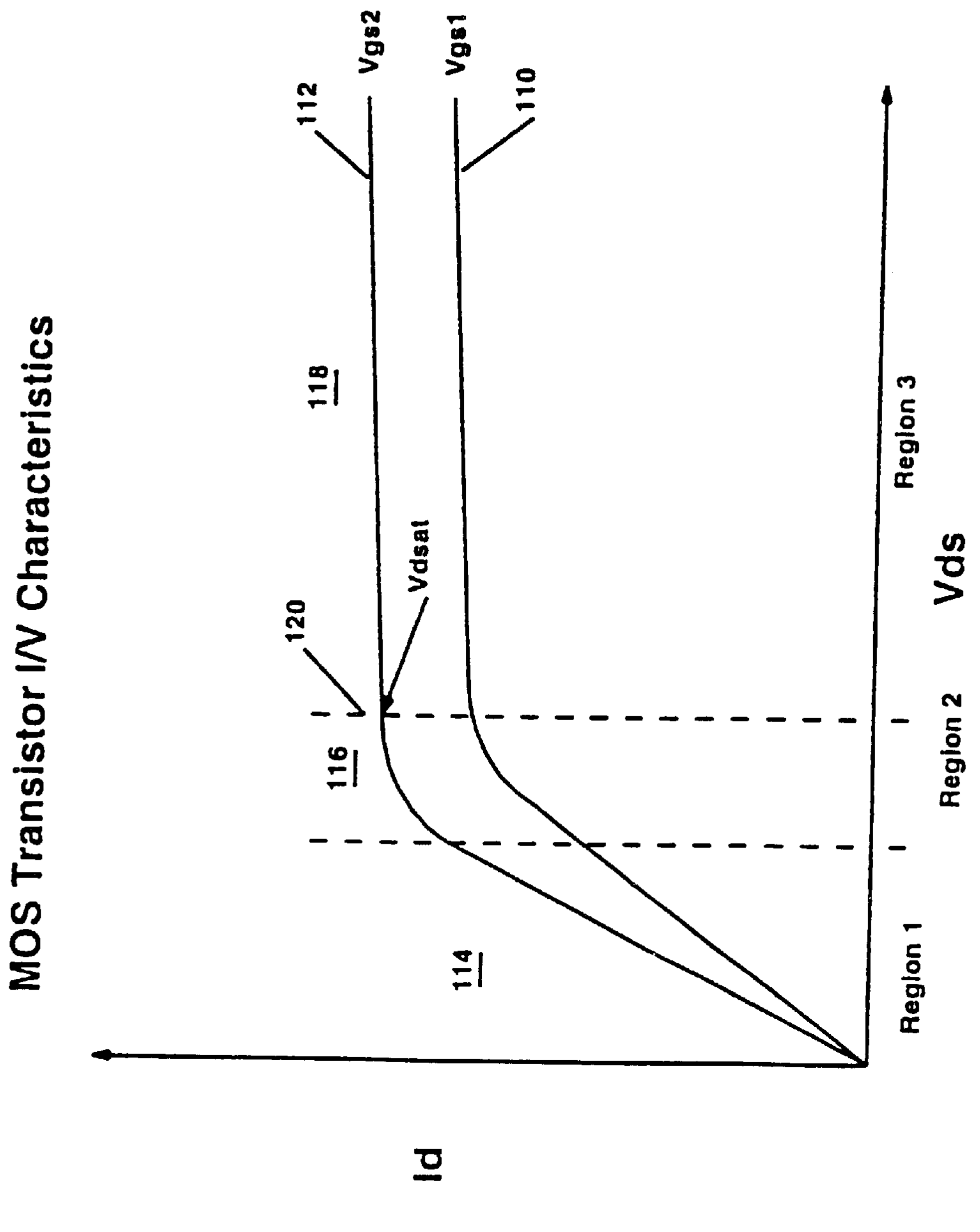
FIG. 4 illustrates the I/V characteristic of a MOS transistor demonstrating current source operation.

The need for precision in the voltage applied to current source 14*a* in order to ensure the accurate current output is shown in FIG. 4 where the I/V characteristics for MOS transistors are shown for two gate voltages $V_{GS}1$ 110 and $V_{GS}2$ 112. MOS transistors operate in a triode or resistive region 1 114, a transition region 2 116 and saturation region 3 118. MOS transistor current sources operate in the saturation region 3 118 where, beyond $V_{dsat}$, a change in voltage results in very little change in current. It is efficacious to operate in that saturation region 3 118 close to the $V_{dsat}$ boundary 120 of that saturation region 118 so that the constant current operation of the transistor can be obtained with a minimum of voltage thereby preserving voltage headroom.

Figure 5:
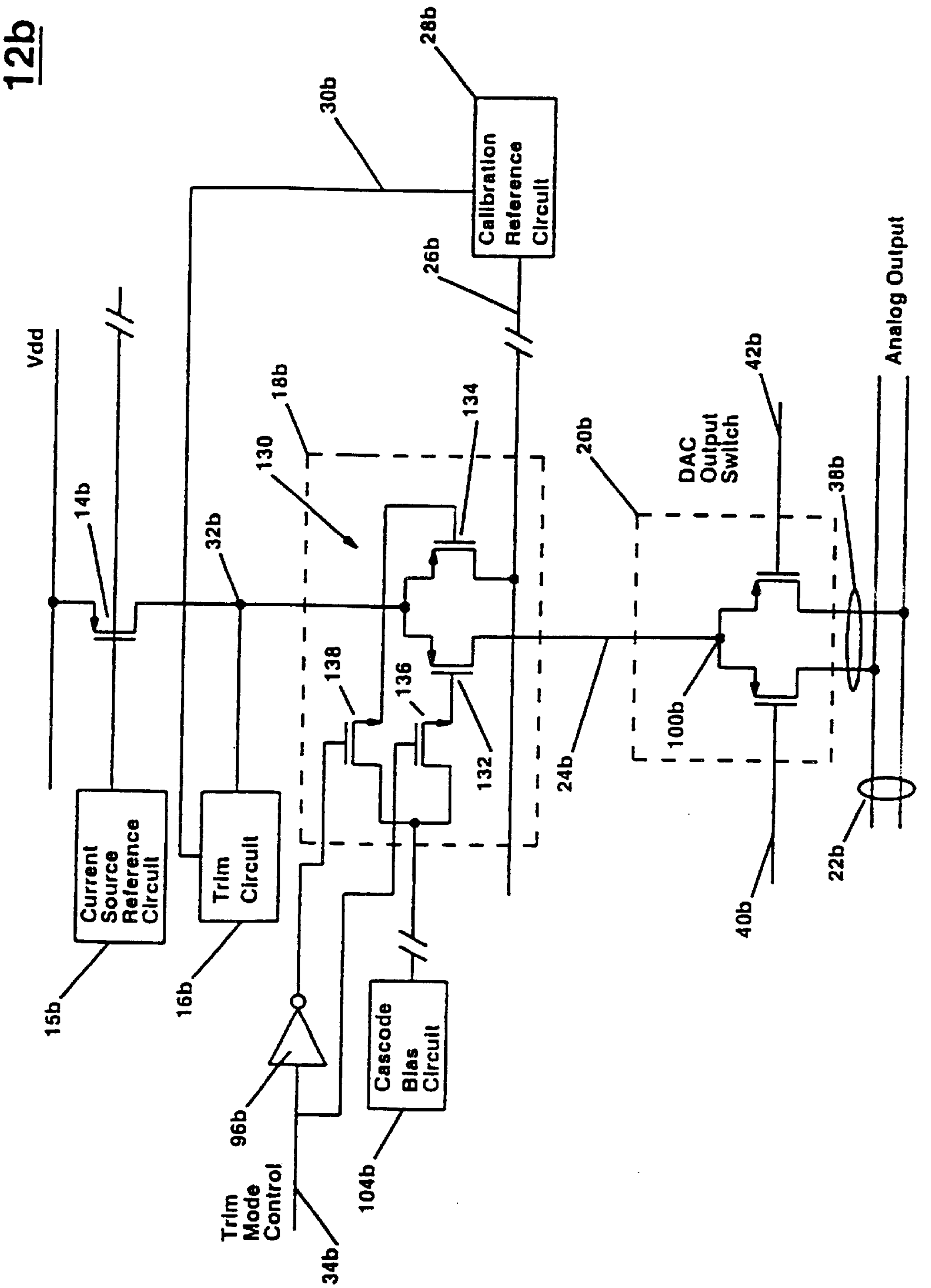
FIG. 5 is a view similar to FIG. 3 of a DAC cell with a calibrated current source employing a cascode calibration switch according to this invention.

In accordance with this invention, calibration switch 18*b*, FIG. 5, includes cascode switch 130 including a pair of cascode switches 132 and 134 which in this case are implemented by PMOSFET's. Although FET's have been used to implement all of the circuits, both prior art and those according to this invention in FIGS. 5 and 6, this is not a necessary limitation of the invention as either P or NMOSFET's or bi-polar transistors may be used. The cascode bias circuit 104*b* provides the bias to turn on and off cascode switches 132 and 134 through switching circuits 136 and 138 and the trim mode signal is still delivered on line 34*b* through inverter 96*b* to switches 136 and 138. In this implementation, however, in contrast to the prior art, the cascode switches 132 and 134 maintain node 32*b* at a constant voltage and so there is a constant voltage across current source 14*b* regardless of in which mode the circuit is operating. As opposed to the prior art voltage mode switches, these cascode switches 132 and 134 maintain the same voltage on output current node 32*b* whether current source 14*b* is connected to the load, current switch 20*b*, or calibration reference circuit 28*b*. This ensures that the current looked at during the calibration mode is an accurate replica of the current that actually flows to the load during the normal operation, and thus any trim current determined by calibration reference circuit 28*b* to be delivered by trim circuit 60*b* will be accurate, and result in a more accurate analog output on-network 22*b*. Cascode switching circuit 130 thus provides isolation and requires minimum headroom providing two major advantages over the prior art.

Figure 6:
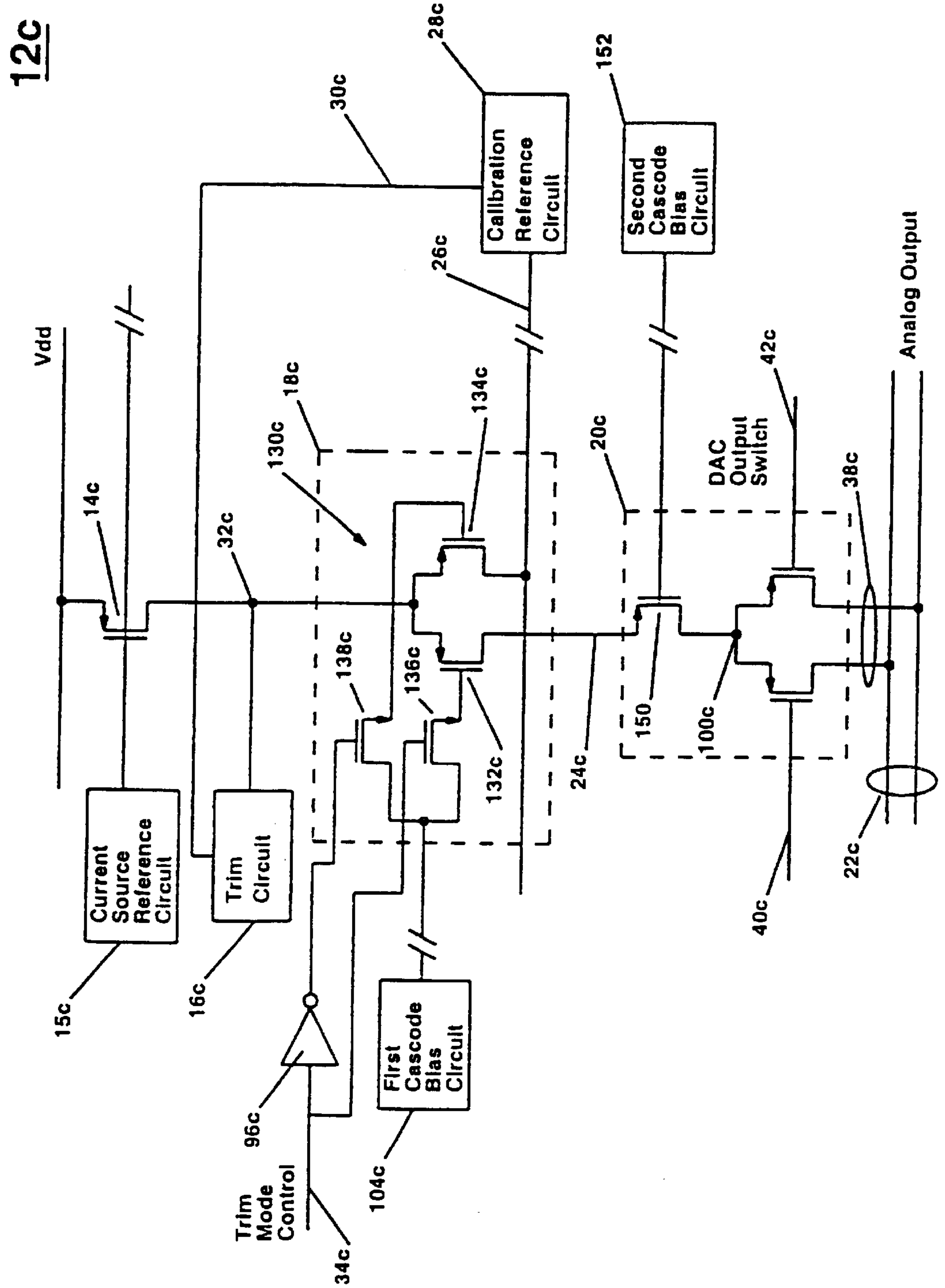
FIG. 6 is a view similar to FIG. 5 employing an additional cascode isolation circuit.

One or more additional isolation cascode circuits 150, FIG. 6, can be included in output switch 20*c* in order to further isolate common source node 100*c* from output current node 32*c* so the perturbations occurring at common source node 100*c* either generated locally or reflected over the analog output network 22*c* do not reach current source 14*c*. Or, if they do reach it they reach it in diminished form as attenuated by the gain of isolation cascode circuit 150 in addition to the attenuation of the gain of the cascode switches 132*c* and 134*c*.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A calibrated current source comprising:

a current source having an output node; a calibration circuit; a load circuit; a cascode switching circuit including a pair of cascode switches, one connected between said load circuit and output node, the other connected between said calibration circuit and said output node; and a bias circuit for selectively applying a bias voltage to said cascode switches to selectively connect said load circuit and said calibration current to said output node while maintaining a constant voltage at said output node and across said current source to provide a consistent current to said load and calibration circuits.

2. The calibrated current source of claim 1 in which said cascode switches include FET's.

3. The calibrated current source of claim 1 in which said current source includes an FET.

4. The calibrated current source of claim 1 in which said load circuit includes an isolation cascode circuit.

5. The calibrated current source of claim 1 in which said load circuit includes a current switching circuit.

* * * * *